(12) United States Patent
Yeh et al.

(10) Patent No.: US 8,238,107 B2
(45) Date of Patent: Aug. 7, 2012

(54) CAP FOR MEMS PACKAGE

(75) Inventors: Jen-Chuan Yeh, Changhua County (TW); Kuo-Ting Lee, Nantou County (TW)

(73) Assignee: Lingsen Precision Industries, Ltd, Taichung (TW)

( * ) Notice: Subject to any disclaimer, the term of this patent is extended or adjusted under 35 U.S.C. 154(b) by 268 days.

(21) Appl. No.: 12/713,309

(22) Filed: Feb. 26, 2010

(65) Prior Publication Data
US 2011/0174532 A1   Jul. 21, 2011

(30) Foreign Application Priority Data
Jan. 20, 2010 (TW) ................. 99201187 U

(51) Int. Cl.
*H01R 4/22* (2006.01)

(52) U.S. Cl. ............. 361/730; 257/704; 257/E21.499; 257/E23.114; 257/E23.078; 361/600; 361/796

(58) Field of Classification Search ......... 257/E21.499, 257/E23.114, E23.078, 704; 361/600, 730, 361/796
See application file for complete search history.

(56) References Cited

U.S. PATENT DOCUMENTS

| | | | | |
|---|---|---|---|---|
| 7,393,758 B2 * | 7/2008 | Sridhar et al. | ................ | 438/460 |
| 2003/0230798 A1 * | 12/2003 | Lin et al. | ................ | 257/704 |
| 2006/0197215 A1 * | 9/2006 | Potter | ................ | 257/704 |
| 2007/0069349 A1 * | 3/2007 | Yang | ................ | 257/676 |

* cited by examiner

*Primary Examiner* — Tuan T Dinh
*Assistant Examiner* — Hung Dang
(74) *Attorney, Agent, or Firm* — Browdy and Neimark, PLLC

(57) ABSTRACT

A cap for a MEMS package includes a main body having a bottom surface, a top surface, a plurality of accommodations recessed from the bottom surface towards the top surface, and a plurality of slots recessed from the top surface towards the bottom surface in a way that the top surface is defined into a plurality of regions corresponding to the accommodations respectively. After completion of the MEMS package, the package can be cut along the slots into a plurality of MEMS package units, such that the cutting work can be done quickly and the cutting burrs can be minimized.

5 Claims, 4 Drawing Sheets

CAP FOR MEMS PACKAGE

BACKGROUND OF THE INVENTION

1. Field of the Invention

The present invention relates generally to cap packages of Micro-Electro-Mechanical System (hereinafter referred to as "MEMS") and more particularly, to a cap for use in a MEMS package.

2. Description of the Related Art

FIG. 1 is a schematic drawing showing a step of making a conventional MEMS package. After a substrate 10, which is basically defined on its top surface into a plurality of regions 13 on each of which a die 12 is bounded, is provided, a plurality of caps 14 are mounted on the substrate 10 one by one for protecting the dies 12 respectively. Thereafter, the substrate 10 thus obtained is cut along the gaps between the regions 13 into a plurality of MEMS package units each containing the die 12. In the step of mounting the caps 14 on the regions 13 of the substrate 10, conductive adhesive is used to mount the caps 14 one by one, resulting tin that the aforesaid mounting step is time-consuming. In addition, the gaps between the regions 13 shall be wider enough in order to be mounted with the cap 14 by adhesive, such that a lot of spaces are wasting.

To resolve the above-mentioned problems, an improved fabrication method of a MEMS package is developed as shown in FIG. 2. The substrate 20 is defined on the top surface thereof into several groups. Each group contains a plurality of regions 26 on each of which a die 24 is mounted. Thereafter, several caps 22, each of which has a plurality of accommodations 222 corresponding to the regions 26 respectively, are provided and mounted on the substrate 20. After completion of the cap mounting work, the caps 22 and the substrate 20 are simultaneously cut along the gaps between the regions 26 into a plurality of MEMS package units each containing the die 24 therein. Compared with the mounting work of the above-mentioned caps 14, the mounting work for the caps 22 is minimized. In addition, the gaps between regions 26 in a group can be reduced to an extent, such that more MEMS package units can be provided for the substrate 20 compared with the substrate 10 of FIG. 1 under a same area. However, since the cutting tool has to cut the bonded substrate 20 and cap 22 at a time in the cutting step, the cutting rate will be reduced and the cutting burrs will occur, such that a fine polishing work for removing the cutting burrs needs to be introduced after the cutting step, costing a lot of time.

In conclusion, it is desired to provide a new cap for use in a MEMS package, which can improve the disadvantages of the conventional caps 14 and 22 shown in FIGS. 1-2.

SUMMARY OF THE INVENTION

The present invention has been accomplished in view of the above-noted circumstances. It is an objective of the present invention to provide a cap for a MEMS package, which can minimize the time needed for the MEMS package process.

To attain the above objective, the present invention provides a cap for a MEMS package, which comprises a main body having a bottom surface, a top surface, a plurality of accommodations recessed from the bottom surface towards the top surface, and a plurality of slots recessed from the top surface towards the bottom surface in a way that the top surface is defined into a plurality of regions corresponding to the accommodations respectively. After the cap provided by the present invention is bonded on a substrate on which a plurality of MEMS dies are provided, the finished package can be cut along the slots into a plurality of MEMS units. In the cutting process, since the to-be-cut thickness of the cap is equal to the distance defined between the bottom portion of the slot and the bottom surface of the main body, which is smaller than the total thickness of the main body of the cap, the cutting work can be done more quickly and the cutting burrs can be minimized. Further, the more the area of the cap can be provided the less the number and times of the caps that are needed to be bonded on the substrate per unit area can be obtained. As a result, the cap provided by the present invention can reduce the bonding times of the cap needed for the MEMS package process and can increase the cutting rate and minimize the cutting burrs occurred during the cutting process, dramatically cutting down the processing time of the MEMS package process.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
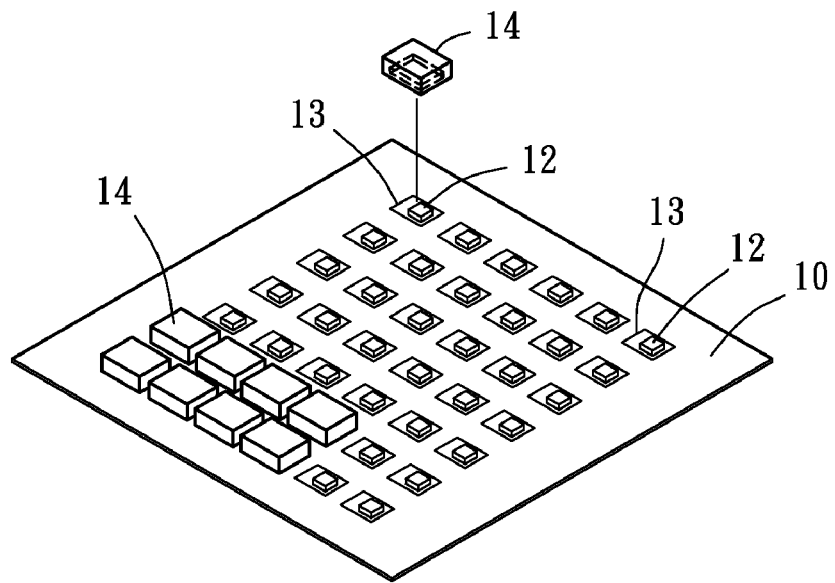
FIG. 1 is a schematic drawing showing a step of making a conventional MEMS package.
Figure 2:
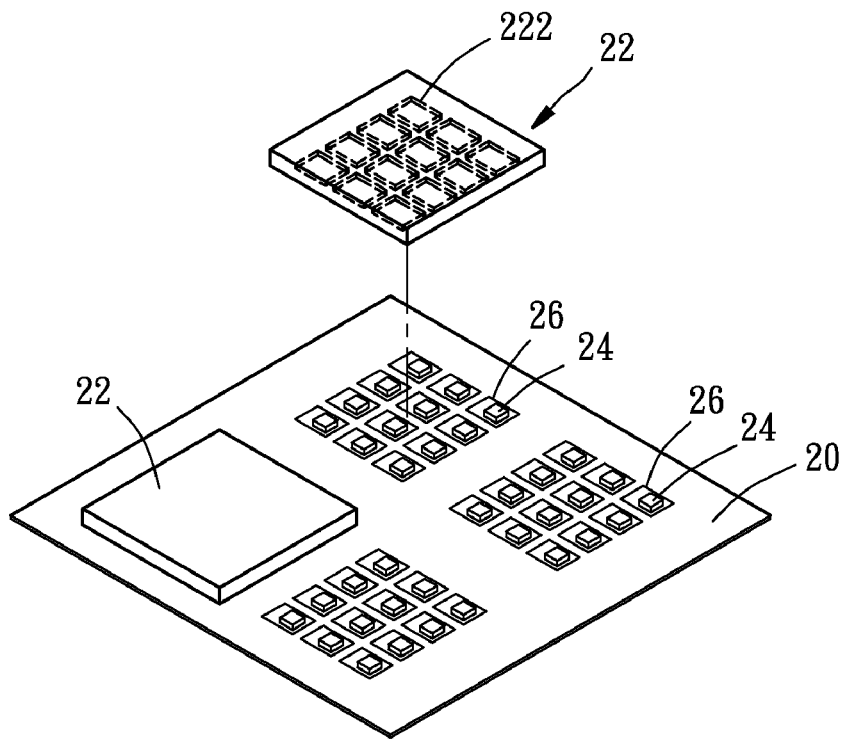
FIG. 2 is another schematic drawing showing a step of making another conventional MEMS package.
Figure 3:
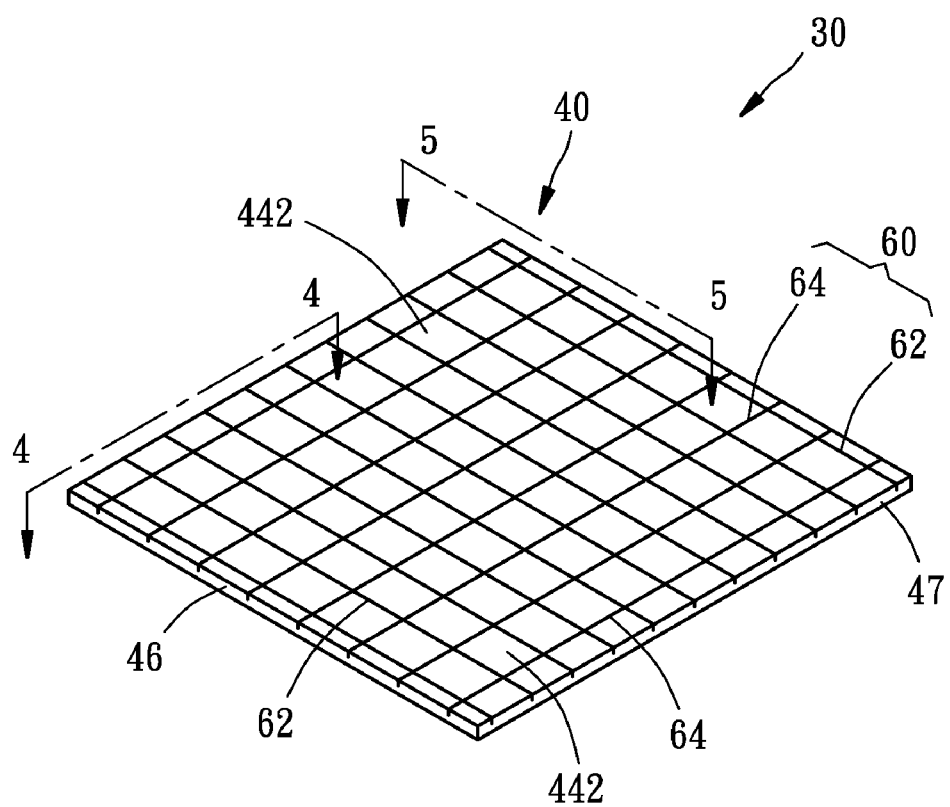
FIG. 3 is a perspective view of a cap for a MEMS package in accordance with a preferred embodiment of the present invention.
Figure 4:
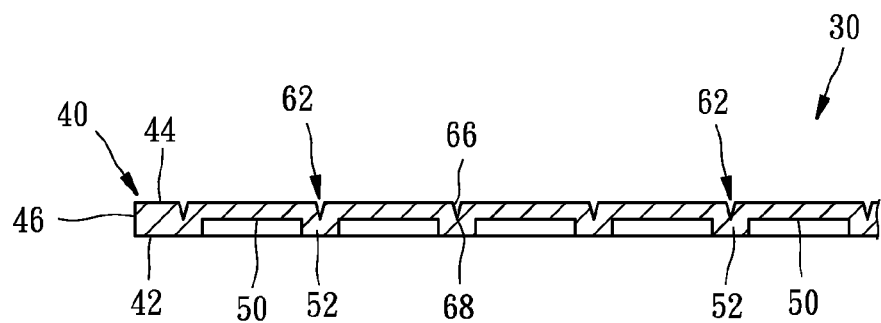
FIG. 4 is a sectional view taken along line 4-4 of FIG. 3.
Figure 5:
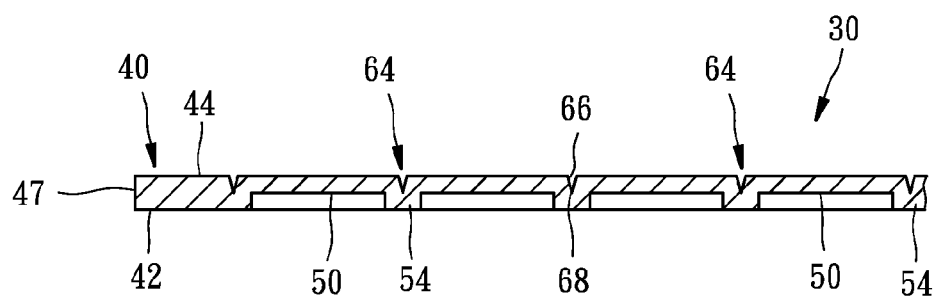
FIG. 5 is a sectional view taken along line 5-5 of FIG. 3.
Figure 6:
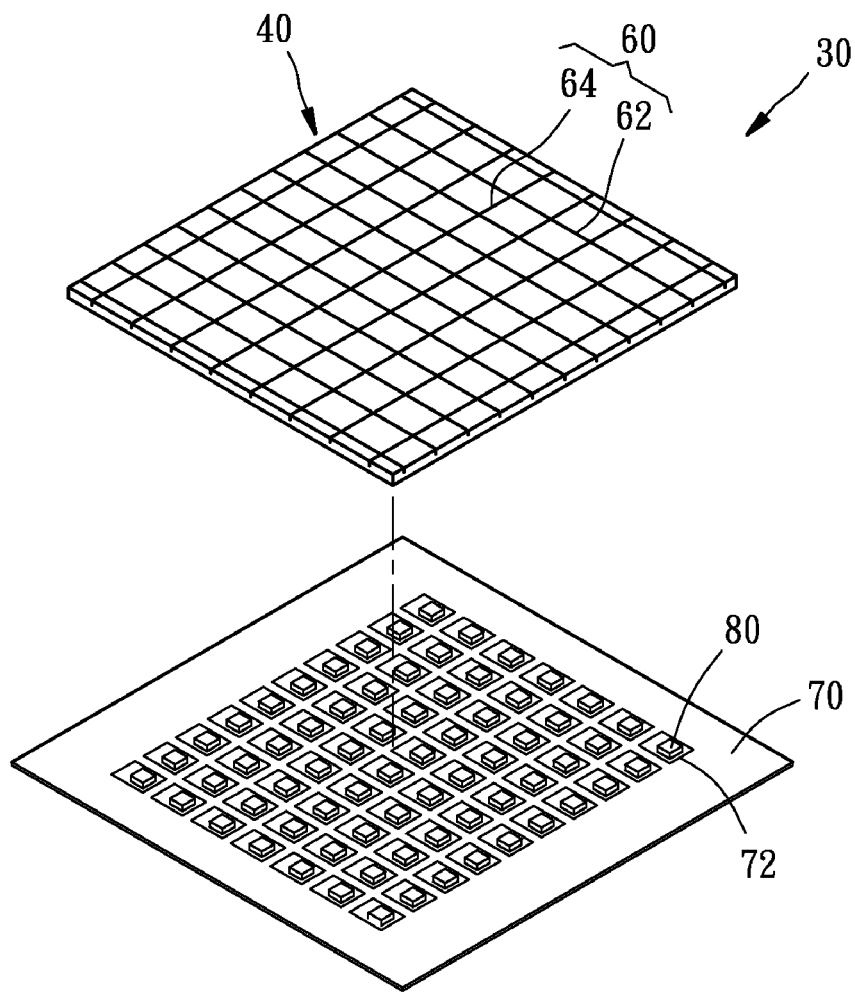
FIG. 6 is a schematic drawing showing a step of making a MEMS package using the cap provided by the preferred embodiment of the present invention.

As shown in FIGS. 3-5, the cap, denoted by reference numeral 30, in accordance with a preferred embodiment of the present invention is used for a MEMS package. The cap 30 includes a main body 40 having a plurality of accommodations 50 recessed from a bottom surface 42 of the main body 40 towards a top surface 44 of the main body 40 at a predetermined depth, and a plurality of slots 60 recessed from the top surface 44 towards the bottom surface 42 at a predetermined depth.

The accommodations 50 each have a rectangular cross-section and are arranged in a matrix format including ten rows of the spaced and parallel accommodations 50 and seven columns of the spaced and parallel accommodations 50, in which every two rows of the accommodations 50 are separated by a transverse partition wall 52 as shown in FIG. 4, and every two columns of the accommodations 50 are separated by a longitudinal partition wall 54 as shown in FIG. 5.

The slots 60 each have an elongated shape when they are viewed along the direction from the top surface 44 towards the bottom surface 42 of the main body 40. The slots 60 can be classified into eleven spaced and parallel transverse slots 62 and eight spaced and parallel longitudinal slots 64. The first and the last transverse slots 62 are arranged adjacent to two transverse lateral sides 46 of the main body 40 and the rest transverse slots 62 are arranged corresponding in position to the centers of the transverse partition walls 52 respectively, as shown in FIG. 4. The first and the last longitudinal slots 64 are arranged adjacent to two longitudinal lateral sides 47 of the main body 40 and the rest longitudinal slots 64 are arranged corresponding in position to the centers of the longitudinal partition walls 54 respectively, as shown in FIG. 5. In addition, the transverse slots 62 and the longitudinal slots 64 are orthogonally intersected, such that the top surface 44 of the main body 40 can be defined by the slots 60 into a plurality of regions 442 corresponding in position to the accommodations 50 respectively. Further, each of the slots 60 has an opening 66 on the top surface 44 of the main body 40 and a bottom portion 68 located between the top surface 44 and the bottom surface 42 of the main body 40. As it can be seen from FIGS. 4 and 5, the opening 66 of the slots 60 has an area larger than that of the bottom portion 68 of the slot 60 and the sectional area of the slot 60 is gradually decreased from the opening 66 thereof towards the bottom portion 68 thereof, such that the slot 60 has a V-shaped cross-section. The depth of the slot 60, i.e. the distance defined between the opening 66 and the bottom portion 68, is about a half of the total thickness of the main body 40, i.e. about a half of the distance defined between the top surface 44 and the bottom surface 42.

Figure 7:
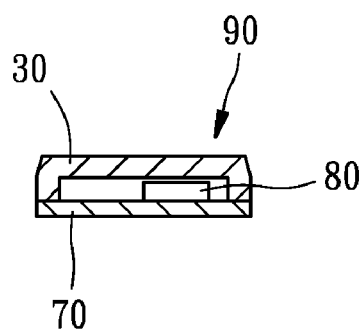
FIG. 7 is a sectional view of a MEMS package unit cut from the MEMS package using the cap provided by the preferred embodiment of the present invention.

Referring to FIGS. 3-6, in the MEMS package process adopting the cap 30 of the present invention, the bottom surface 42 of the main body 40 is adhesively bonded on a substrate 70 having regions 72 in such a way that the accommodations 50 of the main body 40 respectively correspond in position to the regions 72, on each of which a die 80 is bonded. This means that the dies 80 bonded on the regions 72 can be well protected in the accommodations 50 respectively through the one-time adhesively bonding action of the single cap 30, saving the working time of the cap bonding in the MEMS package process. Thereafter, the cap 30 and the substrate 70, which are bonded together, are simultaneously cut along the slots 60 by a cutting tool into a plurality of MEMS package units 90, each of which is composed of a part of the substrate 70, a part of the cap 30 and a die 80, as shown in FIG. 7. In the cutting process, since the to-be-cut thickness of cap 30 is less than the total thickness of the main body 40 of the cap 30, the cutting work can be done more quickly and the cutting burrs can be minimized so as to save the time of the fine polishing step for removing the cutting burrs.

It will be appreciated that the size of the cap 30 and the number and arrangement of the accommodations 50, transverse slots 62 and longitudinal slots 64 will be various subject to the area of the substrate to be covered and the size, number and arrangement of the regions 72. The more the number of the regions 72 that a single cap 30 can cover can be increased the less the gaps defined between the regions 72 can occupy the total area of the substrate 70. By means of the cap 30 provided by the present invention, more MEMS package units 90 can be provided for a substrate per unit area.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A cap for a MEMS package, comprising:
    a main body having a bottom surface, a top surface, a plurality of accommodations recessed from the bottom surface towards the top surface, and a plurality of slots recessed from the top surface towards the bottom surface in a way that the top surface defines a plurality of regions corresponding to said plurality of accommodations;
    wherein the slots each have an opening on the top surface of the main body and a bottom portion between the top surface and the bottom surface of the main body, and the opening has a sectional area wider than that of the bottom portion;
    wherein the sectional area of the slot is gradually decreased from the opening of the slot towards the bottom portion of the slot.

2. The cap as claimed in claim 1, wherein the accommodations are arranged in a matrix format including a plurality of rows of the accommodations and a plurality of columns of the accommodations.

3. The cap as claimed in claim 2, wherein every two said rows of the accommodations are separated by a transverse partition wall and every two said columns of the accommodations are separated by a longitudinal partition wall; the slots includes a plurality of spaced and parallel transverse slots corresponding to the transverse partition walls respectively, and a plurality of spaced and parallel longitudinal slots corresponding to the longitudinal partition walls respectively.

4. The cap as claimed in claim 3, wherein the transverse slots and the longitudinal slots are orthogonally intersected.

5. The cap as claimed in claim 4, wherein the slots each have an opening on the top surface of the main body and a bottom portion between the top surface and the bottom surface of the main body, and the slots each have a sectional area gradually decreased from the opening of the slot towards the bottom portion of the slot.

* * * * *